United States Patent
Suzuki

(10) Patent No.: US 8,135,090 B2
(45) Date of Patent: Mar. 13, 2012

(54) TRANSMISSION DEVICE

(75) Inventor: Masayoshi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 947 days.

(21) Appl. No.: 12/041,786

(22) Filed: Mar. 4, 2008

(65) Prior Publication Data

US 2008/0152036 A1    Jun. 26, 2008

Related U.S. Application Data

(63) Continuation of application No. PCT/JP2005/016537, filed on Sep. 8, 2005.

(51) Int. Cl.
  *H04K 1/02* (2006.01)
  *H03C 3/00* (2006.01)
  *H04B 1/02* (2006.01)
(52) U.S. Cl. .................. 375/296; 375/302; 455/108
(58) Field of Classification Search ............ 375/296, 375/302; 370/208
  See application file for complete search history.

(56) References Cited

U.S. PATENT DOCUMENTS

| | | | |
|---|---|---|---|
| 4,785,442 A | | 11/1988 | Ohtake et al. |
| 5,438,289 A | * | 8/1995 | Kan et al. .................. 327/97 |
| 7,139,534 B2 | * | 11/2006 | Tanabe et al. .............. 455/108 |
| 2003/0053413 A1 | * | 3/2003 | Sawahashi et al. .......... 370/208 |
| 2004/0142696 A1 | * | 7/2004 | Saunders et al. ............ 455/450 |
| 2005/0078768 A1 | * | 4/2005 | Sun et al. .................. 375/297 |
| 2005/0157815 A1 | * | 7/2005 | Kim et al. .................. 375/302 |
| 2005/0163252 A1 | * | 7/2005 | McCallister et al. ......... 375/296 |
| 2006/0188032 A1 | * | 8/2006 | Kim et al. .................. 375/260 |
| 2007/0211821 A1 | * | 9/2007 | Haque et al. ................ 375/297 |

FOREIGN PATENT DOCUMENTS

| | | |
|---|---|---|
| JP | 63-18529 | 1/1988 |
| JP | 2-82847 | 3/1990 |
| JP | 05-014429 | 1/1993 |
| JP | 5-22356 | 1/1993 |
| JP | 10-178357 | 6/1998 |
| JP | 2001-12317 | 1/2001 |
| JP | 2001-069017 | 3/2001 |
| JP | 2001-339452 | 12/2001 |
| JP | 2004-110892 | 4/2004 |

OTHER PUBLICATIONS

"Japanese Office Action" mailed by JPO and corresponding to Japanese application No. 2007-534223 on Feb. 22, 2011, with English translation.

International Search Report dated Nov. 29, 2005, from the corresponding International Application.

* cited by examiner

*Primary Examiner* — David C. Payne
*Assistant Examiner* — Sarah Hassan
(74) *Attorney, Agent, or Firm* — Fujitsu Patent Center

(57) ABSTRACT

A transmission device of the present invention comprises: an orthogonal modulator performing orthogonal modulation on a carrier wave using an input signal comprising an in-phase signal component and an orthogonal signal component, and outputs a modulation signal to be transmitted; a detection unit detecting a carrier leaking component included in the modulation signal; a DC offset value computing unit computing a DC offset value to be added to the input signal for compensating the carrier leaking component, based on the carrier leaking component; and an abnormality judgment unit judging abnormality of the orthogonal modulator based on the DC offset value. By monitoring the DC offset value, a failure of the orthogonal modulator or an indication thereof is detected, and transmission of an abnormal modulation signal including a distortion component is prevented. An increase of the leaking power to adjacent channels, which causes the quality deterioration in adjacent radio communication lines, can be prevented.

5 Claims, 5 Drawing Sheets

TRANSMISSION DEVICE

CROSS REFERENCE TO RELATED APPLICATIONS

This application is a continuation of International Application No. PCT/JP2005/16537, filed on Sep. 8, 2005, now pending, herein incorporated by reference.

TECHNICAL FIELD

The present invention relates to a transmission device having an orthogonal modulator for modulating carrier waves based on an orthogonal modulation system, and more particularly to a transmission device which prevents an orthogonal modulator abnormality which causes quality deterioration in other radio communication lines.

BACKGROUND ART

Today various services are provided using radio communications, and the demand for allocating new frequencies for new services is constantly increasing. However radio frequencies are a limited shared resource, and in order to efficiently use frequencies, the spacing of each frequency band in use is becoming closer and closer.

In the radio communication for portable telephones, an orthogonal modulation system for a modulating carrier wave by an input signal comprised of an in-phase signal component and an orthogonal signal component is used as a modulation method for transmission signals. In the case of an orthogonal modulation system, carrier leaking components are generated in the modulated waves, and if the amount of carrier leaking components is high, the error rate of reproduced data in demodulation at the receive side increases, which causes a quality deterioration of other radio communication lines. Therefore carrier leaking components must be suppressed. In order to suppress carrier leaking in the output of the modulator, the DC component is decreased to zero in the orthogonal modulator. A conventional way of adjusting carrier leaking is to adjust an input signal comprised of an in-phase signal component and an orthogonal signal component so that the DC component in the base band input of the orthogonal modulator becomes zero.

FIG. 1 is a diagram depicting a configuration example of a conventional transmission device. Each input signal comprised of an in-phase signal component (I component) and orthogonal signal component (Q component) is input to an orthogonal modulator 14 by way of an adder 10,11 and a D/A converter 12, 13 respectively. The orthogonal modulator 14 modulates a carrier wave from a local oscillator 15 based on these signals, and outputs a transmission modulation signal. The transmission modulation signal which is output from the orthogonal modulator 14 is amplified by an amplifier 16, and is output. A part of the transmission modulation signal is fetched by a directional coupler 17, and is converted into a demodulation signal by a demodulation unit 18. A DC offset computing unit 19 detects a carrier leaking component from the demodulation signal, and inputs a DC offset value, whereby the carrier leaking component included in the transmission modulation signal is the minimum, to the adder 10, 11. The adder 10, 11 adds the DC offset value to each input signal.

The configuration of the orthogonal modulator which compensates the carrier leaking component using the DC offset value is disclosed in Patent Documents 1 and 2, for example.

Patent Document 1 Japanese Patent Application Laid-Open NO. H5-22356

Patent Document 2 Japanese Patent Application Laid-Open NO. No. 2001-339452

DISCLOSURE OF THE INVENTION

In this transmission device, if the orthogonal modulator fails, a distortion component is generated in the transmission modulation signal, and leaking power to the adjacent channels increases even if DC offset compensation is performed for the carrier leaking component. An increase of leaking power to the adjacent channels deteriorates the quality of the adjacent radio communication lines.

In particular, if the adjacent radio communication line is a frequency band in use by another service company, a major societal problem may develop. Therefore in order to prevent causing quality deterioration in adjacent radio communication lines, an abnormality and the failure of the orthogonal modulator must be predicted in advance, or be quickly detected.

With the foregoing in view, it is an object of the present invention to provide a transmission device which detects an abnormality of an orthogonal modulator.

To achieve the above object, a first configuration of a transmission device according to the present invention has: an orthogonal modulator performing orthogonal modulation on a carrier wave using an input signal composed of an in-phase signal component and an orthogonal signal component, and outputs a modulation signal to be transmitted; a detection unit detecting a carrier leaking component included in the modulation signal; a DC offset value computing unit computing a DC offset value to be added to the input signal for compensating the carrier leaking component, based on the carrier leaking component; and an abnormality judgment unit judging the abnormality of the orthogonal modulator based on the carrier leaking component or the DC offset value.

A second configuration of the transmission device of the present invention is the above mentioned first configuration, characterized in that the abnormality judgment unit compares the carrier leaking component value or the DC offset value with a predetermined threshold value, and judges that the orthogonal modulator exhibits abnormality, when the value deviates from the predetermined threshold value.

A third configuration of the transmission device of the present invention is the above mentioned first configuration, characterized in that the abnormality judgment unit compares two of the carrier leaking component values or the DC offset values acquired at different sampling timings, and judges that the orthogonal modulator exhibits abnormality when the direction of change in an increase or decrease of the values is in an identical direction continuously for a predetermined number of times.

A fourth configuration of the transmission device of the present invention is the above mentioned first configuration characterized in that the abnormality judgment unit compares two of the carrier leaking component values or the DC offset values obtained at different sampling timings, and judges that the orthogonal modulator exhibits abnormality when the difference value thereof exceeds a predetermined value.

A fifth configuration of the transmission device of the present invention is one of the above mentioned second to fourth configurations, characterized in that the carrier leaking component value or the DC offset value, which the abnormality judgment unit uses for comparison, is an average value of a plurality of carrier leaking component values or the DC offset values obtained at a plurality of sampling timings.

A sixth configuration of the transmission device of the present invention is one of the above mentioned first to fifth configurations, characterized in that the abnormality judgment unit stops transmission of the modulation signal when judgment is made that the orthogonal modulator exhibits abnormality.

According to the present invention, failure of an orthogonal modulator or an indication thereof can be detected, and transmission of an abnormal modulation signal including the distortion component can be prevented by monitoring a carrier leaking component or DC offset value thereof. In other words, an increase of leaking power to adjacent channels, which cause quality deterioration in adjacent radio communication lines, can be prevented.

EXPLANATION OF REFERENCE NUMERALS

Figure 1:
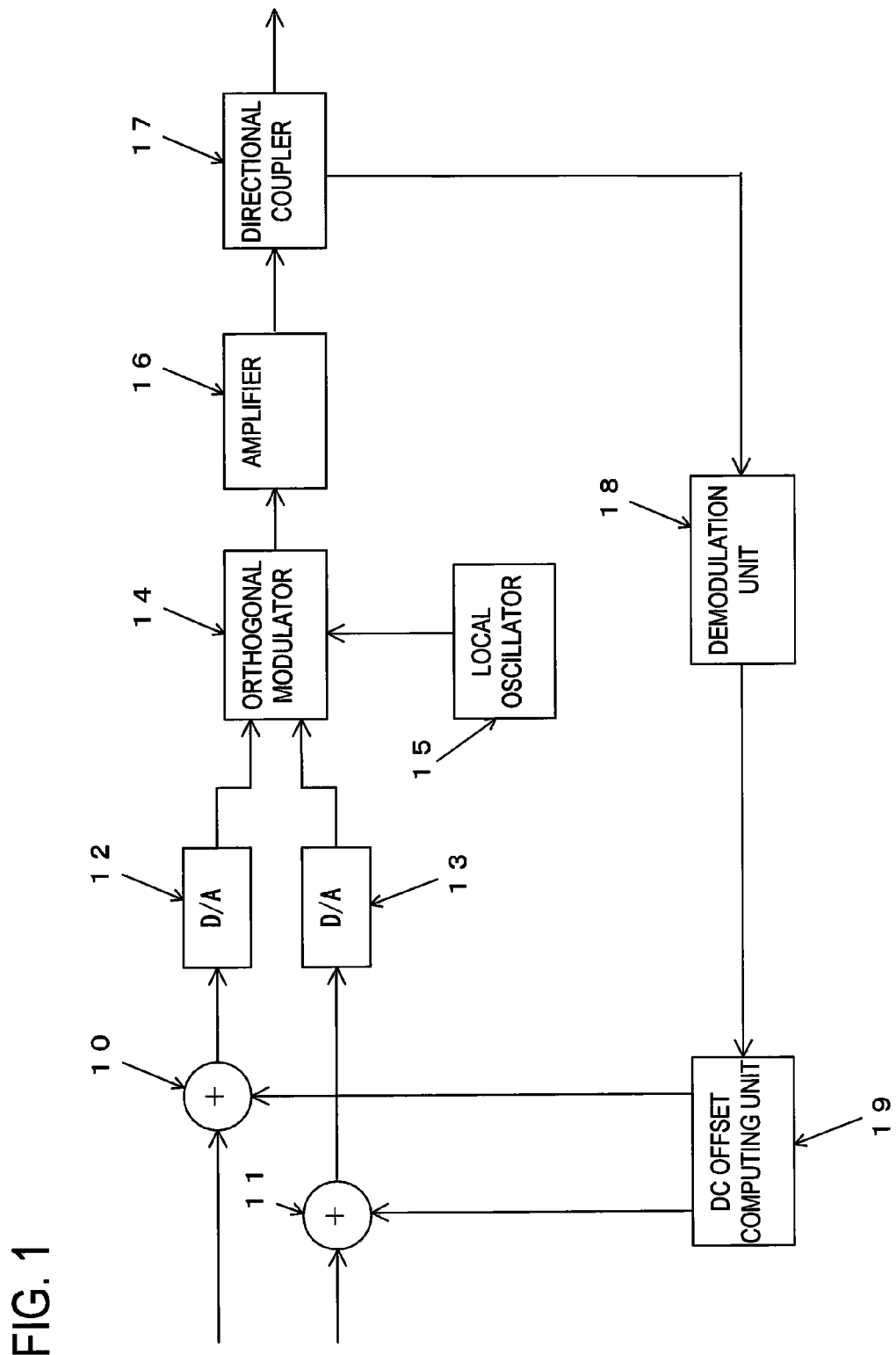
FIG. 1 is a diagram depicting a configuration example of a conventional transmission device.

14: orthogonal modulator
15: local oscillator
16: amplifier
17: directional coupler
18: demodulation unit
19: DC offset value computing unit
20: monitoring control unit
21: power control unit

BEST MODE FOR CARRYING OUT THE INVENTION

Embodiments of the present invention will now be described with reference to the drawings. These embodiments, however, shall not limit the technical scope of the present invention.

Figure 2:
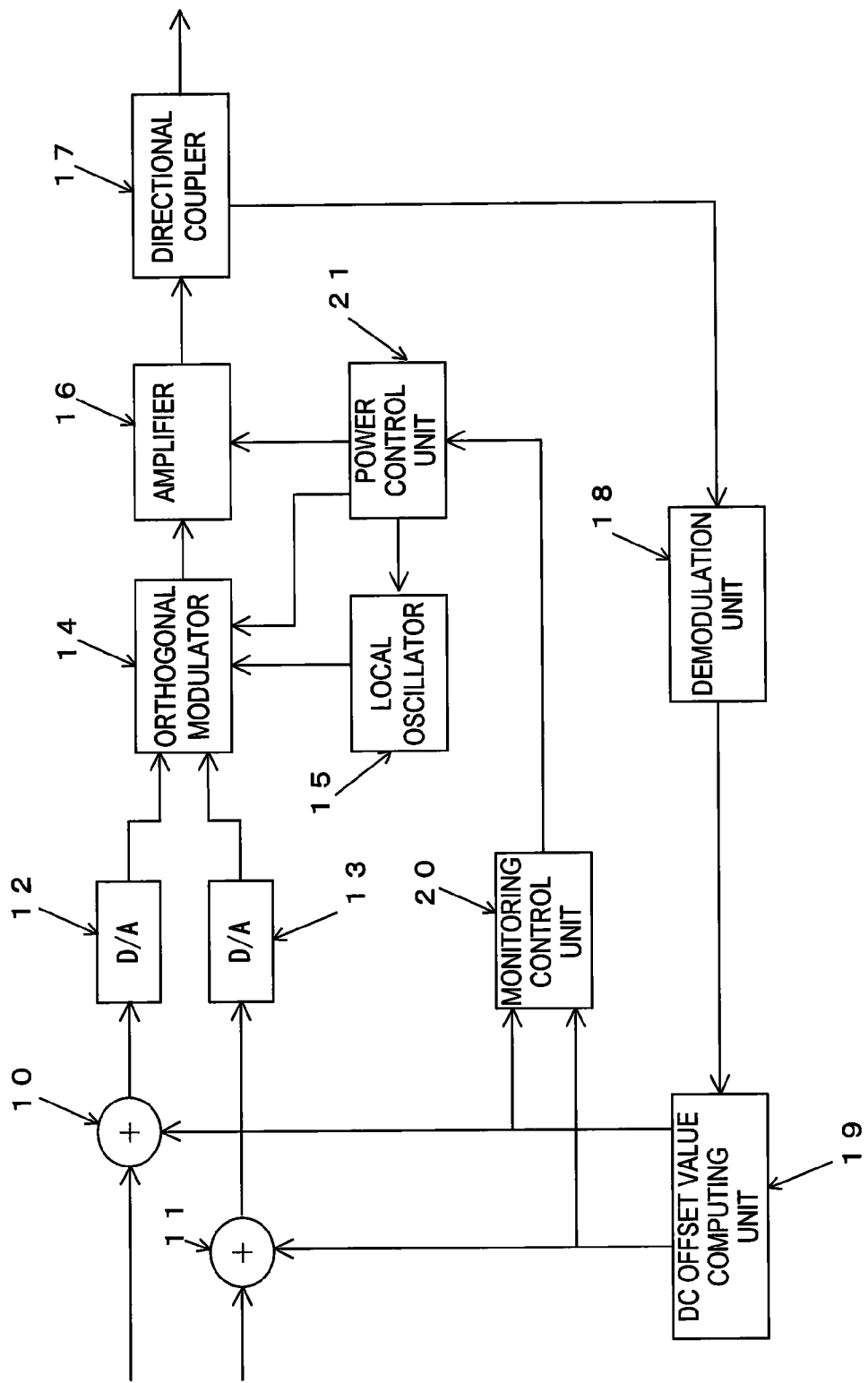
FIG. 2 is a diagram depicting a configuration example of an embodiment of the present invention.

FIG. 2 is a diagram depicting a configuration example of a transmission device according to an embodiment of the present invention. In FIG. 2, each input signal comprised of an in-phase signal component (I component) and orthogonal signal component (Q component) is input to an orthogonal modulator 14 by way of each adder 10, 11 and D/A converter 12, 13 respectively. The orthogonal modulator 14 modulates a carrier wave from a local oscillator 15 using these signals, and outputs a transmission modulation signal. The transmission modulation signal, which is output from the orthogonal modulator 14, is amplified by an amplifier 16, and is output from an antenna (not illustrated) via a directional coupler 17. A part of the output from the amplifier 16 is fetched by the directional coupler 17, and is converted into a demodulation signal by a demodulation unit 18. A DC offset computing unit 19 detects a carrier leaking component from the demodulation signal, and inputs a DC offset value, whereby the carrier leaking component included in the transmission modulation signal becomes the optimum, into the adder 10, 11, and also into a monitoring control unit 20. The adder 10, 11 adds the DC offset to each input signal. A power supply control unit 21 controls the ON/OFF of a power supply of the amplifier 16 using a signal from the monitoring control unit 20, and stops the operation of the amplifier 16.

The monitoring control unit 20 compares the DC offset value and the upper and lower limit values which are set in advance, and if the DC offset value deviates from the upper and lower limit values, [the monitoring control unit 20] outputs a power OFF signal to the power control unit 21. By the power OFF signal, the power control unit 21 turns the power of the amplifier 16 OFF, and stops the operation of the amplifier 16. This stops the transmission of the modulation signal. For the upper and lower limit values, values are set in advance considering a range where [the DC offset value] fluctuates when the orthogonal modulator 14 is operating normally.

The DC offset value, whereby the carrier leaking component leaks from the orthogonal modulator 14, becomes the optimum, fluctuates somewhat depending on such environment conditions as temperature, but is maintained within a predetermined range if the orthogonal modulator 14 is operating normally.

If an abnormality, such as a failure, occurs to the orthogonal modulator 14, the DC offset value deviates from the predetermined range. According to the present invention, the monitoring control unit 20, which predicts and monitors an abnormality of the orthogonal modulator 14 based on the DC offset value, is provided, so that the output of the transmission modulation signal is stopped if the monitoring control unit 20 judges that the orthogonal modulator 14 is abnormal. Specifically, the monitoring control unit 20 compares the DC offset value and the upper and lower limit values which are set in advance, and judges that the orthogonal modulator 14 is abnormal if the DC offset value deviates from the upper and lower limit values. Deviation of the DC offset value from the upper and lower limit values itself does not indicate a failure of the orthogonal modulator 14, but [the monitoring control unit 20] judges this as a high possibility of failure which may occur in the near future, and makes the judgment that the orthogonal modulator 14 is abnormal.

In this way, by monitoring the DC offset value, failure of an orthogonal modulator or indication thereof is detected, and the transmission of an abnormal modulation signal including the distortion component can be prevented. In other words, an increase of leaking power to adjacent channels, which cause quality deterioration in adjacent radio communication lines, can be prevented.

Stopping the output of the transmission modulation signal is implemented by the power supply control unit 21 stopping the power supply to the amplification unit 16. The transmission of the modulation signal can be stopped not only by shutting the power OFF to the amplifier 16, but also by shutting the power OFF to the orthogonal modulator 14 or the local oscillator 15.

Figure 3:
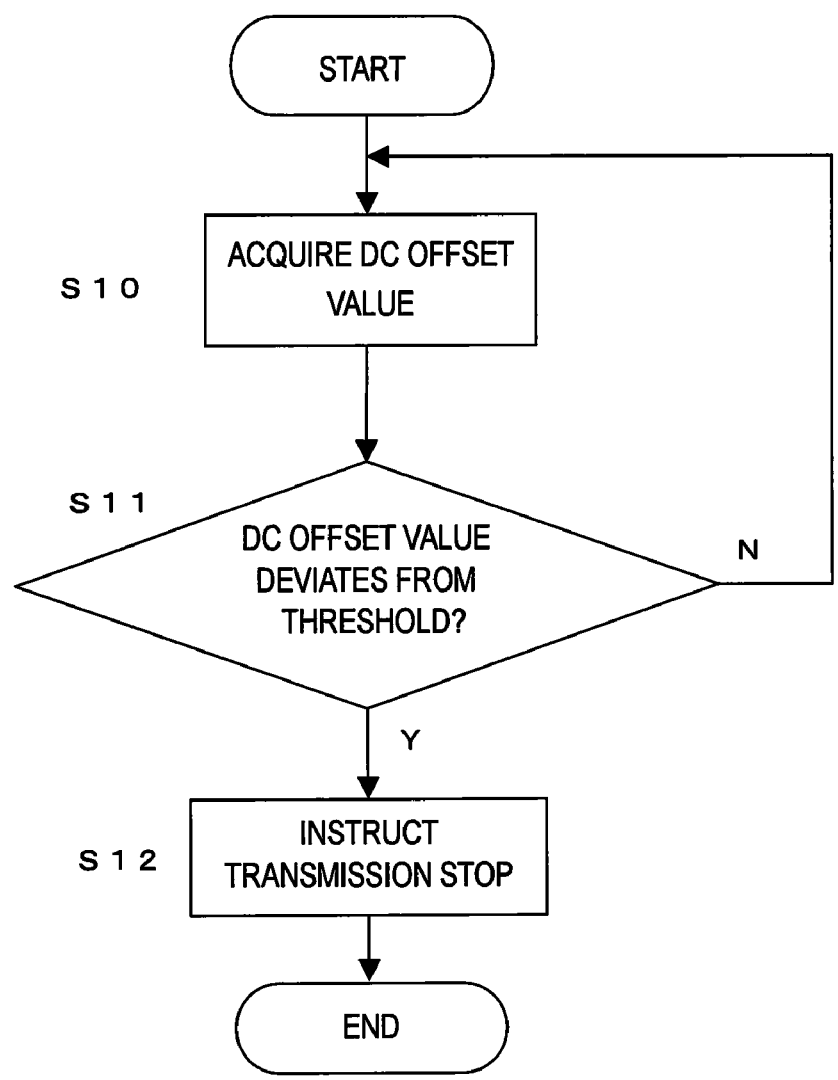
FIG. 3 is a flow chart depicting a first processing example of a monitoring control unit 20.

FIG. 3 is a flow chart depicting a first processing example of the monitoring control unit 20. The monitoring control unit 20 acquires the DC offset value of the in-phase signal component (I component) and orthogonal signal component (Q component) respectively at each sampling timing (S10), and compares each acquired DC offset value with predetermined upper and lower limit values (threshold values) to judge an abnormality (S11). If one of the DC offset values of the in-phase signal component (I component) and orthogonal signal component (Q component) deviates from the threshold values, it is judged as abnormal, and [the monitoring control unit 20] outputs a power OFF signal to the power control unit 21 to stop the transmission of the modulation signal (S12). If both of the DC offset values of the in-phase signal component (I component) and orthogonal signal component (Q component) are within the threshold, it is judged as no abnormality, and monitoring continues.

In the first processing example, it is preferable that the monitoring control unit 20 acquires the DC offset values for a plurality of times, determines an average value thereof, and compares this average value and predetermined upper and lower limit values (threshold values) to judge an abnormality.

Figure 4:
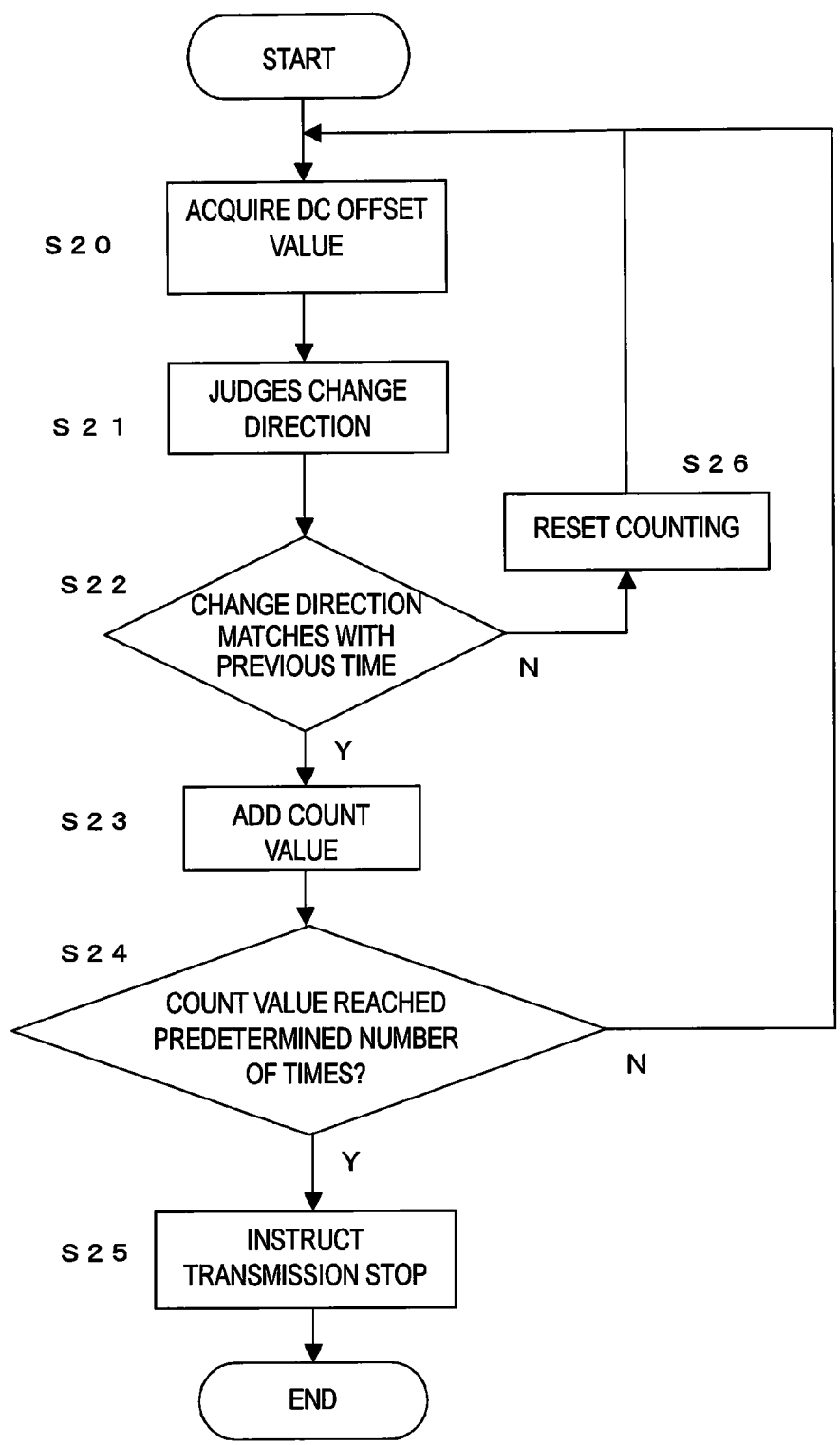
FIG. 4 is a flow chart depicting a second processing example of the monitoring control unit 20.

FIG. 4 is a diagram depicting a second processing example of the monitoring control unit 20. The monitoring control unit 20 acquires the DC offset values of the in-phase signal component (I component) and orthogonal signal component (Q component) respectively at each sampling timing (S20), and compares each of the acquired DC offset values with previously acquired offset values thereof respectively to judge the change direction (S21). The change direction indicates an increase/decrease of the DC offset value, where it can be judged whether the DC offset value acquired at this timing is greater or lesser than the DC offset value acquired at the previous timing.

When the change direction is judged, it is judged whether the change direction at the previous timing is the same as the change direction at this timing (S22). If the change direction at the previous timing is a DC offset value increase (decrease) direction, and the change direction at this timing is also an DC offset value increase (decrease) timing, then it is judged that the change directions are the same. If the change direction at the previous timing is a DC offset value increase (decrease) direction, and the change direction at this timing is a DC offset value decrease (increase) direction, then it is judged that the change directions are the opposite. If the change directions are the same, the number of times when [the change directions] are the same is counted (S23), and it is judged whether this count reached the predetermined count (S24). If the count value reaches a predetermined count, it is judged as abnormal, so the power OFF signal is output to stop the transmission of the modulation signal (S25). If the count does not reach the predetermined count, it is judged as no abnormality, and monitoring is continued. If the change direction is different from the previous time in S22, the count is reset (S26), and monitoring is continued.

Counting is performed for the DC offset values of the in-phase signal component (I component) and orthogonal signal component (Q component) respectively, and if either one of the count values reaches a predetermined count, it is judged as abnormal, and if both of the count values do not reach the predetermined count, it is judged as no abnormality.

The DC offset value repeatedly fluctuates at roughly a constant level within the upper and lower limit values during normal operation. Therefore the DC offset value which continuously changes in a same direction for a plurality of times is regarded as an abnormal change for the DC offset value, and can be judged as an indication of failure of the orthogonal modulator 14. Hence according to the second processing example, an abnormality of the orthogonal modulator 14 is judged by the DC offset value changing in a same direction continuously for a predetermined number of times, regardless whether the DC offset value deviates from the upper or lower limit values.

In the second processing example, it is preferable that the DC offset values are acquired for a plurality of times, and the change direction thereof is judged using the average value thereof.

Figure 5:
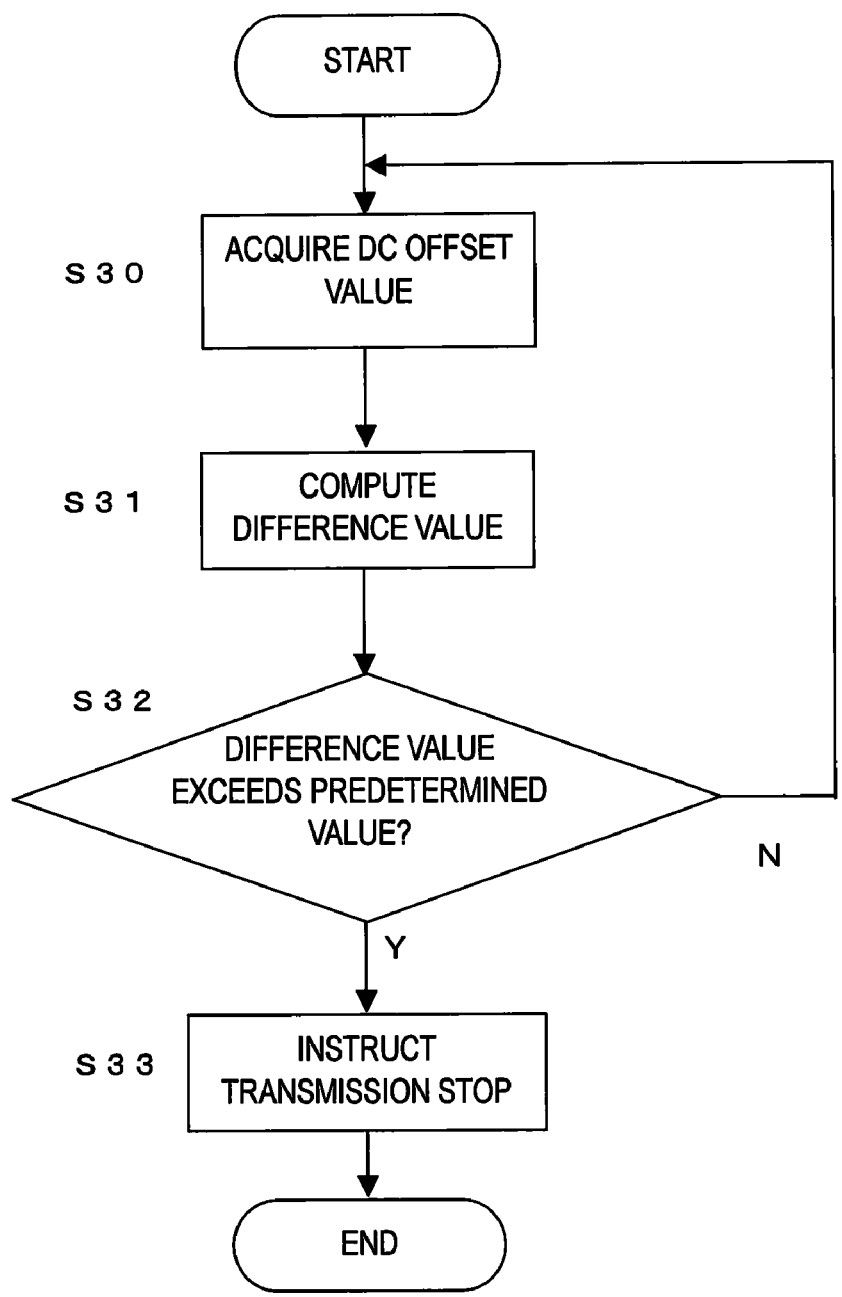
FIG. 5 is a flow chart depicting a third processing example of the monitoring control unit 20.

FIG. 5 is a diagram depicting a third processing example of the monitoring control unit 20. The monitoring control unit 20 acquires the DC offset values of the in-phase signal component (I component) and orthogonal signal component (Q component) respectively at every sampling timing (S30), computes the difference between each of the acquired DC offset values and respective offset value acquired at the previous timing (S31), and judges whether the difference value is greater than a predetermined value which is set in advance (S32). If the difference value exceeds a predetermined value, it is judged as abnormal, and [the monitoring control unit 20] outputs a power OFF signal to stop transmission of the modulation signal (S33). If the difference value is within the predetermined value, it is judged as no abnormality, and monitoring is continued. The difference value is determined for the DC offset values of the in-phase signal component (I component) and orthogonal signal component (Q component) respectively, and if either one of the difference values exceeds the predetermined value, it is judged as an abnormality, and if both of the difference values are within the predetermined value, it is judged as no abnormality.

As described in the second processing example, the DC offset value repeatedly fluctuates roughly at a constant level within the upper and lower limit values, and does not fluctuate greatly during normal operation. Therefore the DC offset value which change considerably exceeds an expected value can be regarded as an abnormal change of the DC offset value, and can be judged as an indication of a failure of the orthogonal modulator 14. Hence according to the third processing example, the DC offset value which changes beyond a predetermined value is judged as an abnormality of the orthogonal modulator 14 regardless whether the DC offset value deviates from the upper and lower limit values.

In the third processing example as well, it is preferable that the DC offset values are acquired for a plurality of times so that the judgment based on the above mentioned difference value is performed using the average value thereof.

The monitoring control unit 20 may execute at least two abnormality judgment processings, instead of one, out of the above mentioned first to third processings, so that the power OFF signal is output if it is judged as an abnormality in one processing.

The monitoring control unit 20 may output an alarm before outputting the power OFF signal when it is judged as abnormal. For example, an alarm may be output when it is judged as abnormal for the first time, and the power OFF signal is output when it is judged as abnormal for the second time.

In the first processing, two levels of threshold values may be set so that an alarm is output when [the DC offset value] deviates from the first level threshold value, and the power OFF signal is output when [the DC offset value] deviates from the second level threshold value. A similar processing also becomes possible by setting two levels of predetermined values for the count value in the second processing, or for the difference value in the third processing.

The alarm output and the power OFF signal output, in the case when it is judged as abnormal, may be changed depending on the type of processing. For example, the monitoring control unit 20 may output a power OFF signal if it is judged as abnormal in the first processing, and outputs an alarm if it is judged as abnormal in the second processing.

In the above mentioned embodiments, the monitoring control unit 20 acquires the DC offset values which are output from the DC offset computing unit 19 and judges an abnormality, but can also perform a similar processing by acquiring carrier leaking components included in the demodulation signal, which is output from the demodulation unit 18, since the carrier leaking component included in the demodulation signal, which is output from the demodulation unit 18, and the DC offset value for compensating the carrier leaking component, are closely interrelated.

INDUSTRIAL APPLICABILITY

The present invention can be applied to a transmission device which modulates and transmits carrier waves based on the orthogonal modulation system in a radio communication field.

The invention claimed is:

1. A transmission device, comprising:
   a modulator which performs orthogonal modulation on a carrier wave using an input signal comprising an in-phase signal component and an orthogonal signal component, and outputs a modulation signal to be transmitted;
   a detector which detects a carrier leaking component included in the modulation signal; and
   a controller which obtains a DC offset value for compensating the carrier leaking component, based on the carrier leaking component, and judges the abnormality of the modulator based on the carrier leaking component or the DC offset value,
   wherein the controller compares the carrier leaking component value or the DC offset value with a predetermined threshold value, and judges that the modulator exhibits abnormality, when the value deviates from the predetermined threshold value.

2. A transmission device, comprising:
   a modulator which performs orthogonal modulation on a carrier wave using an input signal comprising an in-phase signal component and an orthogonal signal component, and outputs a modulation signal to be transmitted;
   a detector which detects a carrier leaking component included in the modulation signal; and
   a controller which obtains a DC offset value for compensating the carrier leaking component, based on the carrier leaking component, and judges the abnormality of the modulator based on the carrier leaking component or the DC offset value,
   wherein the controller compares two of the carrier leaking component values or the DC offset values acquired at different sampling timings, and judges that the modulator exhibits abnormality when a direction of change in an increase or decrease of the values is an identical direction continuously for a predetermined number of times.

3. A transmission device, comprising:
   a modulator which performs orthogonal modulation on a carrier wave using an input signal comprising an in-phase signal component and an orthogonal signal component, and outputs a modulation signal to be transmitted;
   a detector which detects a carrier leaking component included in the modulation signal; and
   a controller which obtains a DC offset value for compensating the carrier leaking component, based on the carrier leaking component, and judges the abnormality of the modulator based on the carrier leaking component or the DC offset value,
   wherein the controller compares two of the carrier leaking component values or the DC offset values obtained at different sampling timings, and judges that the modulator exhibits abnormality when a difference value thereof exceeds a predetermined value.

4. The transmission device according to claim 1, wherein the carrier leaking component value or the DC offset value, which the controller uses for comparison, is an average value of a plurality of carrier leaking component values or the DC offset values acquired at a plurality of sampling timings.

5. The transmission device according to claim 1, wherein the controller stops transmission of the modulation signal when judgment is made that the modulator exhibits abnormality.

* * * * *